(12) United States Patent
Cleeves et al.

(10) Patent No.: US 6,541,312 B2
(45) Date of Patent: Apr. 1, 2003

(54) FORMATION OF ANTIFUSE STRUCTURE IN A THREE DIMENSIONAL MEMORY

(75) Inventors: James M. Cleeves, Redwood City, CA (US); Michael A. Vyvoda, Fremont, CA (US); N. Johan Knall, Sunnyvale, CA (US)

(73) Assignee: Matrix Semiconductor, Inc., Santa Clara ( * ) Notice: Subject to any disclaimer, the term of this patent is extended or adjusted under 35 U.S.C. 154(b) by 0 days.

(21) Appl. No.: 09/746,083

(22) Filed: Dec. 22, 2000

(65) Prior Publication Data

US 2003/0003632 A1 Jan. 2, 2003

(51) Int. Cl.[7] .............................................. H01L 21/82
(52) U.S. Cl. ........................ 438/131; 365/159; 365/175
(58) Field of Search .............................. 438/131, 467, 438/600; 257/550; 365/175, 159

(56) References Cited

U.S. PATENT DOCUMENTS

| | | | |
|---|---|---|---|
| 4,543,594 A | | 9/1985 | Mohsen et al. |
| 4,694,566 A | * | 9/1987 | Conner et al. ............... 438/130 |
| 4,876,220 A | | 10/1989 | Mohsen et al. |
| 4,881,114 A | | 11/1989 | Mohsen et al. |
| 5,492,597 A | * | 2/1996 | Keller ........................... 216/67 |
| 5,745,407 A | * | 4/1998 | Levy et al. ...................... 257/1 |
| 5,831,325 A | * | 11/1998 | Zhang .......................... 257/530 |
| 5,835,396 A | | 11/1998 | Zhang |
| 6,034,882 A | | 3/2000 | Johnson et al. |
| 6,185,122 B1 | * | 2/2001 | Johnson et al. .............. 365/103 |

OTHER PUBLICATIONS

"A Novel High–Density, Low–Cost Diode Programmable Read Only Memory," by de Graaf, Woerlee, Hart, Lifka, de Vreede, Janssen, Sluijs & Paulzen, *IEDM–96*, beginning at p. 189.

* cited by examiner

Primary Examiner—William David Coleman
(74) Attorney, Agent, or Firm—Blakely, Sokoloff, Taylor & Zafman LLP

(57) ABSTRACT

The present invention is directed to novel antifuse arrays and their methods of fabrication. According to an embodiment of the present invention an array comprises a plurality of first spaced apart rail-stacks having a top semiconductor material. A fill dielectric is located between the first plurality of spaced apart rail-stacks wherein the fill dielectric extends above the top surface of the semiconductor material. An antifuse material is formed on the top of the semiconductor material of the first plurality of spaced apart rail-stacks. A second plurality of spaced apart rail-stacks having a lower semiconductor material is formed on the antifuse material.

In the second embodiment of the present invention the array comprises a first plurality of spaced apart rail-stacks having a top semiconductor material. A fill dielectric is located between the first plurality of spaced apart rail-stacks wherein the fill dielectric is recessed below the top surface of the semiconductor material. An antifuse material is formed on the top semiconductor material of the first plurality of spaced apart rail-stacks. A second plurality of spaced apart rail-stacks having a lower semiconductor film is formed on the antifuse material.

58 Claims, 13 Drawing Sheets

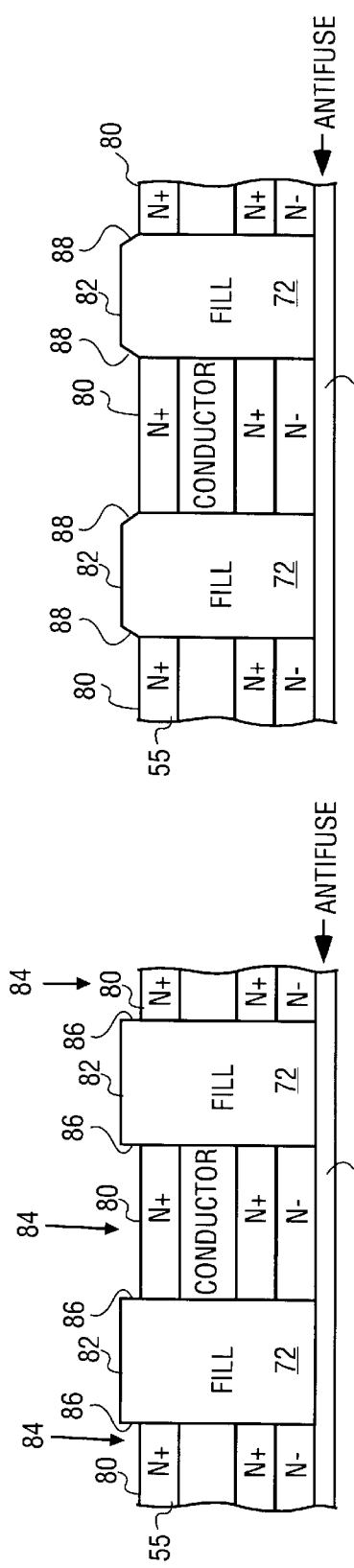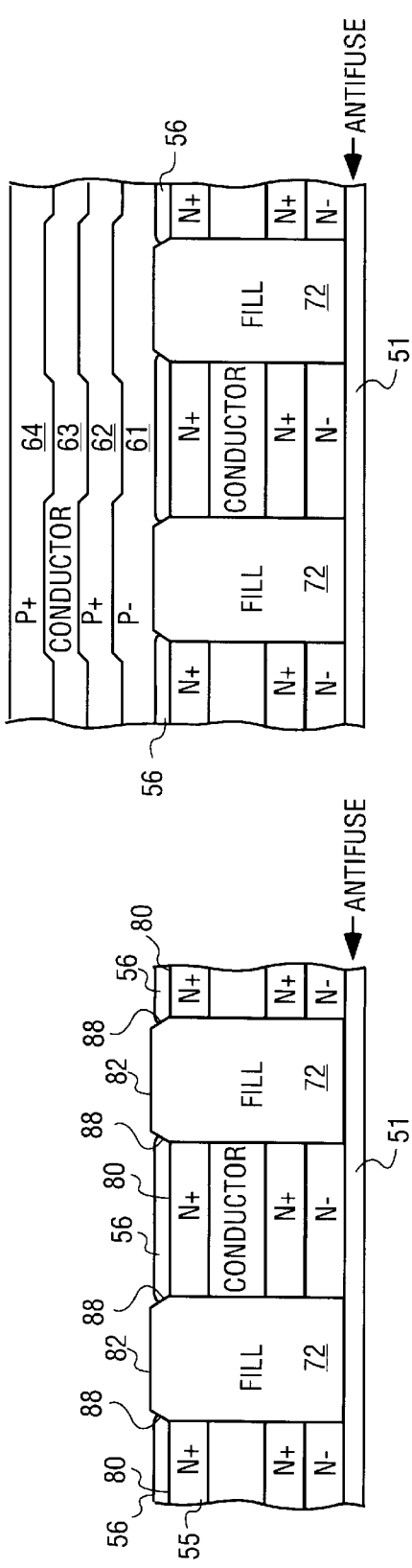

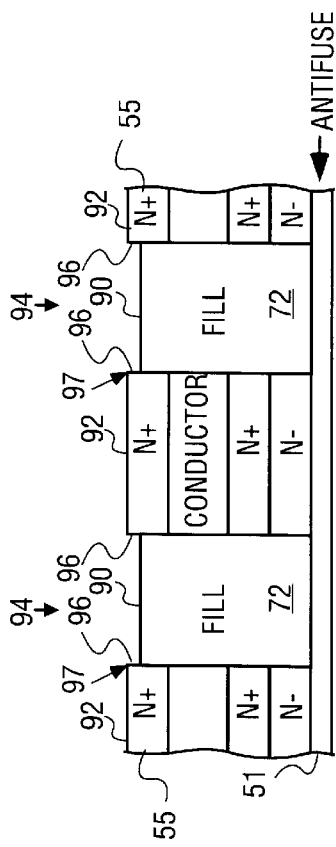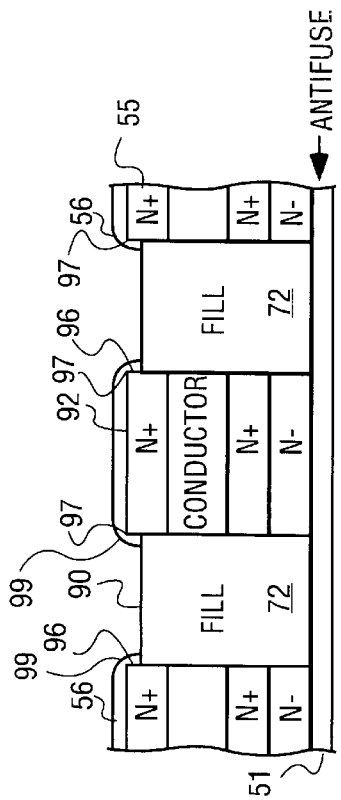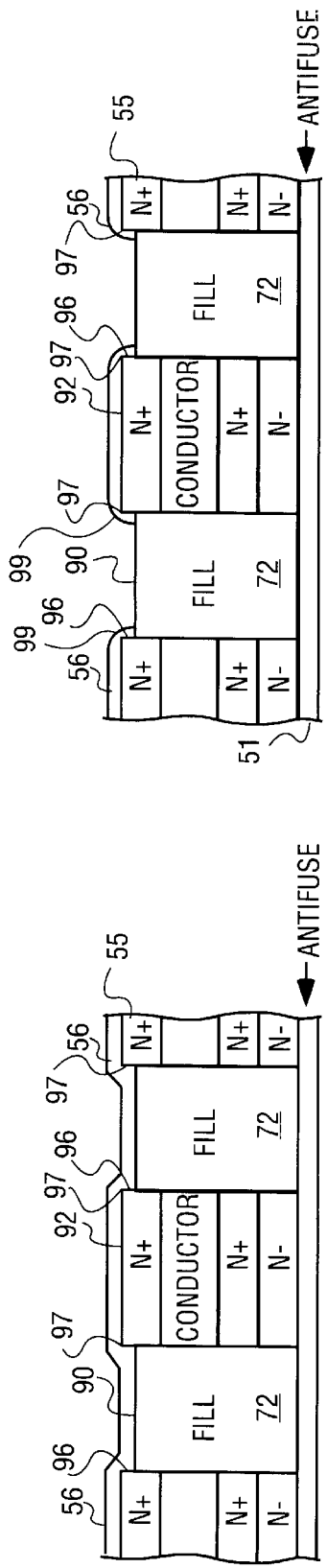

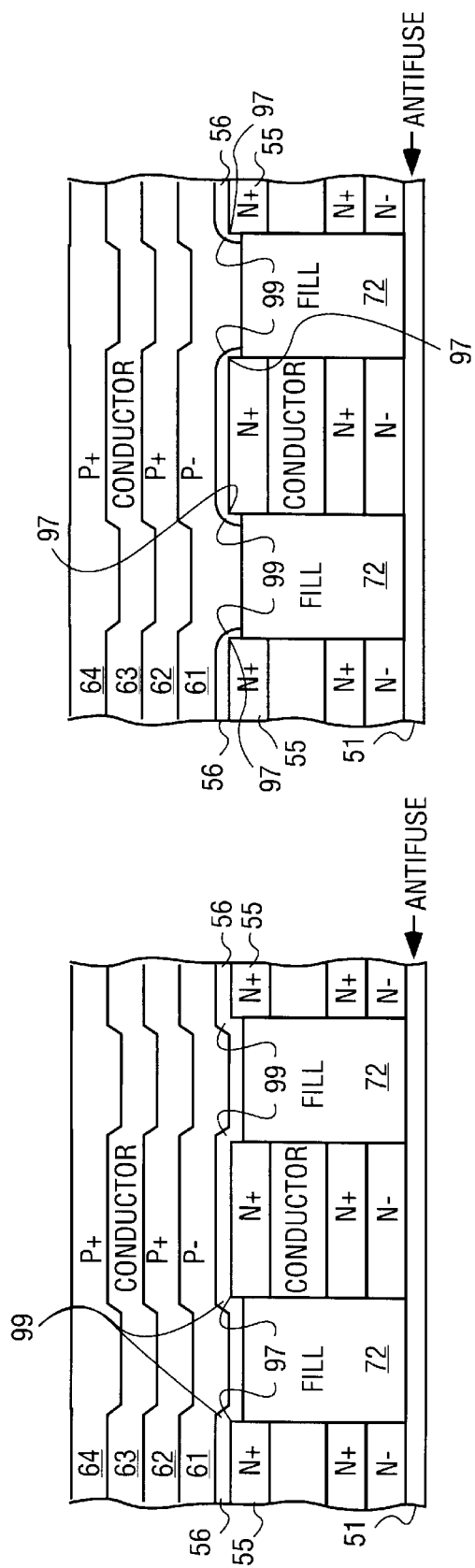

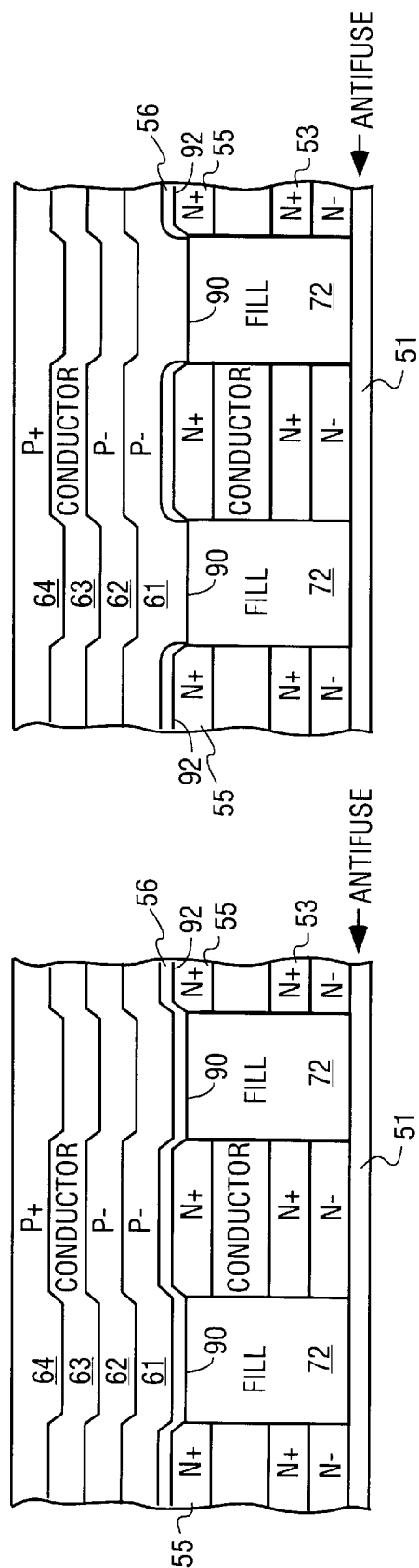

FORMATION OF ANTIFUSE STRUCTURE IN A THREE DIMENSIONAL MEMORY

BACKGROUND OF THE INVENTION

1. Field of the Invention

The present invention relates to the field of vertically stacked field programmable nonvolatile memories and methods of fabrication.

2. Discussion of Related Art

In co-pending application Ser. No. 09/560,626, entitled "Three-Dimension Memory Array Method of Fabrication" assigned to the assignee of the present invention, a 3-D memory array is disclosed employing rail-stacks. The rail-stacks in each layer are parallel, spaced-apart lines in the memory which include conductors and a semiconductor region which forms one-half a diode. An antifuse layer such as a silicon dioxide layer separates the rail-stacks in each layer.

As will be seen, the present invention provides an improved method for forming part of this memory which includes the antifuse layer.

It has been known for many years that electrical fields can be enhanced at sharp corners, rough surfaces and the like. Such enhanced electric fields are used to assist in transferring electrical charge through tunneling and avalanche injection. In other instances, the enhanced electric field and the thinner oxide that can result at protrusion, is used to assist in programming an antifuse layer. See U.S. Pat. Nos. 4,099, 196; 4,119,995 and 5,915,171.

SUMMARY OF THE INVENTION

The present invention is directed to novel antifuse arrays and their methods of fabrication. According to an embodiment of the present invention an array comprises a plurality of first spaced apart rail-stacks having a top semiconductor material. A fill dielectric is located between the first plurality of spaced apart rail-stacks wherein the fill dielectric extends above the top surface of the semiconductor material. An antifuse material is formed on the top of the semiconductor material of the first plurality of spaced apart rail-stacks. A second plurality of spaced apart rail-stacks having a lower semiconductor material is formed on the antifuse material.

In the second embodiment of the present invention the array comprises a first plurality of spaced apart rail-stacks having a top semiconductor material. A fill dielectric is located between the first plurality of spaced apart rail-stacks wherein the fill dielectric is recessed below the top surface of the semiconductor material. An antifuse material is formed on the top semiconductor material of the first plurality of spaced apart rail-stacks. A second plurality of spaced apart rail-stacks having a lower semiconductor film is formed on the antifuse material.

BRIEF DESCRIPTION OF THE DRAWINGS

FIG. 11A illustrates the structure of FIG. 9 after the recessing of the top silicon film beneath the fill dielectric.

FIG. 11B illustrate the structure of FIG. 11A after the beveling of the sidewalls of the fill dielectric.

FIG. 11C illustrates the structure of FIG. 11B after an antifuse layer is grown.

FIG. 11D illustrates the structure of FIG. 11C after the formation of a plurality of rail stacks.

FIG. 12A illustrates the structure of FIG. 9 after the recessing of the fill dielectric beneath the top silicon film of the rail stacks.

FIG. 12B-1 illustrates the structure of FIG. 12A after the deposition of an antifuse material.

FIG. 12B-2 illustrates the structure of FIG. 12A after an antifuse material is grown.

FIG. 12C-1 illustrates the structure of FIG. 12B-1 after a plurality of rail stacks are formed.

FIG. 12C-2 illustrates the structure of FIG. 12B-2 after the formation of a plurality of rail stacks.

FIG. 13C-1 illustrates the structure of FIG. 13B after the deposition of an antifuse material.

FIG. 13C-2 illustrates the structure of FIG. 13B after the antifuse materials is grown.

FIG. 13D-1 illustrates the structure of FIG. 13C-1 after the formation of a plurality of rail stacks.

FIG. 13D-2 illustrates the structure of FIG. 13C-2 after the formation of a plurality of rail stacks.

DETAILED DESCRIPTION OF THE PRESENT INVENTION

Figure 1:
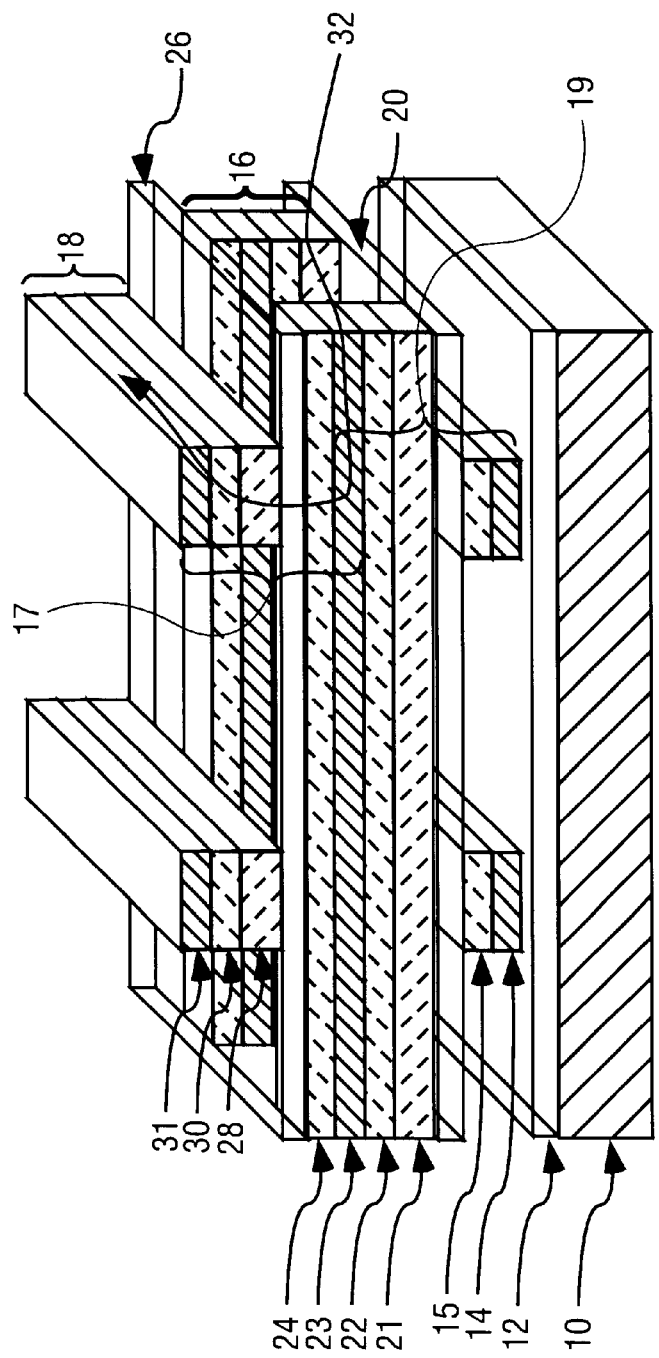
FIG. 1 is a perspective view of a cut-away portion of a memory array.

The present invention is a three-dimensional array which is field programmable. In the following description numerous specific details are set forth such as specific material and layer thicknesses. It will be apparent, however, to one skilled in the art that the present invention may be practiced without these specific details. In other instances, well-known circuits and fabrication techniques have not been set forth in detail in order not to unnecessarily obscure the present invention.

The present invention is a novel antifuse memory and its method of fabrication. The present invention utilizes a surface treatment or a hard mask process to produce an antifuse structure which enhances antifuse performance by providing a more controllable and reliable programming (breakdown) voltage. The antifuse memory of the present invention comprises a first plurality of spaced apart rail-stacks having a top semiconductor material of a first conductivity type. A fill dielectric is formed between the individual rail-stacks. An antifuse material, such as silicon dioxide, is formed over the first plurality of rail-stacks. A second plurality of spaced apart rail-stacks having a lower semiconductor material of opposite polarity than the first semiconductor material, is then formed over the antifuse layer and over the first plurality of spaced apart rail-stacks and the fill dielectric. The second plurality of spaced apart rail-stacks is generally in a direction perpendicular to the first plurality of spaced apart rail-stacks. Each of the intersections of the first rail-stacks and the second rail-stacks generate an antifuse memory cell. The cells are programmable by providing a relatively high voltage (5–20 volts) between the rail-stacks of a given memory cell so as to forward bias the diode created by using semiconductor materials of different conductivity types in the first and second spaced apart rail-stacks. The relatively high voltage causes a breach or rupture in the antifuse layer which creates a diode. Without the high voltage the antifuse layer remains an insulator. Thus by selecting pairs of conductors, diodes can be selectively formed so as to program the array.

According to the present invention a surface treatment or hard mask process is used to insure that all memory cells of the array can be programmed at substantially the same voltage by controlling the locations at which the antifuse material ruptures and/or by controlling the thicknesses uniformity of the antifuse material.

In one embodiment of the present invention, a short semiconductor material etch is used prior to antifuse deposition or growth in order to slightly recess the semiconductor material below the top surface of dielectric fill between the spaced apart rail-stacks. In an embodiment of the present invention the semiconductor material is recessed to a fraction of the thickness of which a deposited antifuse material is to be formed so that the antifuse material can be deposited uniformly on the semiconductor region. Alternatively, the semiconductor material can be recessed to a depth greater than the thickness of the antifuse material and than the antifuse material grown on the semiconductor film. Because the recess is deeper than the thickness of the antifuse material, the antifuse material is confined between adjacent fill dielectrics thereby creating a uniform thickness antifuse film across the semiconductor material surface. By recessing the semiconductor material, the antifuse material is formed to a uniform thickness between the semiconductor materials of the first and second rail-stacks thereby enabling a more uniform and reproducible programming of the antifuse across the memory array.

In an alternative embodiment of the present invention, the fill dielectric is recessed below the top surface of the semiconductor material prior to antifuse deposition. By slightly recessing the fill dielectric, a convex corner or protrusion is generated in the semiconductor material. By creating and exposing a corner of the semiconductor material the antifuse always "blows" or ruptures at the corner of the semiconductor material because of the high electric fields experienced at the corner. Because each antifuse blows at the corner, each cell will have substantially the same programming voltage.

Thus, according to the surface treatment embodiments of the present invention, a slight recess etch of the fill dielectric or of the semiconductor material is done prior to antifuse deposition or growth in order to generate antifuse cells which are programmed at the same voltage. Controlling the sigma of the breakdown voltage of an antifuse is extremely valuable in that it allows one to reduce the margin between write and read, reducing the voltage required from drivers, thus reducing their power and therefore the amount of substrate area they require. Additionally, limiting the total area at the critical thickness of the antifuse increases both yield and reliability.

In yet another embodiment of the present invention, a hard mask is used during rail stack patterning and as a polish stop during chemical mechanical planarization (CMP) of the gap fill dielectric. The height of the gap fill dielectric is selected in order to affect the protrusion or recession of the array line once the hard mask is stripped. The protrusion or recession is selected in order to manipulate the antifuse rupture (i.e., cell programming) process.

Overview of the Structure of the Invented Memory Array

The invented memory array is fabricated on several levels and, for instance, may have eight levels of storage. Each level includes a first plurality of parallel spaced-apart rail-stacks running in a first direction and a second plurality of rail-stacks or conductors (depending on the embodiment) running in a second direction. Generally, the first rail-stacks run perpendicular to the second conductors/rail-stacks and hence form a right angle at their intersections.

The use of rail-stacks is a departure from prior art three-dimensional memories where conductors alone were used in lieu of rail-stacks, and where discrete cells (e.g., pillars) were formed at the intersections of the lines. As will be seen, a bit is stored at each of the intersections of rail-stacks. However, there is no apparent individual memory cell at the intersections, rather memory cells are defined by the rail-stacks and intermediate layers. This makes it easier to fabricate the invented array as will be seen. When the array is fabricated all the bits are in the zero (or one) state and after programming, the programmed bits are in the one (or zero) state.

In the embodiment FIG. 1 several rail-stacks are illustrated in the partial cross-section of the invented array. For instance, rail-stack 16 is shown at one height and a half rail-stack 18 is shown at a second height above the first height. Also, half rail-stacks are disposed between rail-stack 16 and a substrate 10. These lower rail-stacks run in the same direction as the half rail-stack 18. A bit is stored at the intersection of rail-stacks and, for instance, a "cell" is present between the rail-stacks and layers shown within the bracket 17 and another within the bracket 19. Each of these brackets span a memory level.

The array is fabricated on a substrate 10 which may be an ordinary monocrystaline silicon substrate. Decoding circuitry, sensing circuits, and programming circuits are fabricated in one embodiment within the substrate 10 under the memory array using, for instance, ordinary MOS fabrication techniques. Vias are used to connect conductors within the rail-stacks to the substrate to allow access to each rail-stack in order to program data into the array and to read data from the array. For instance, the circuitry within the substrate 10 may select rail-stack 16 and the rail stack 18 in order to either program or read a bit associated with the intersection of these rail-stacks.

As shown in FIG. 1, an insulating layer 12 is formed over the substrate in order that the array may be fabricated above the substrate. This layer may be planarized with, for instance, chemical-mechanical polishing (CMP) to provide a flat surface upon which the array may be fabricated.

Following this, a conductive layer 14 is formed on the substrate. As will be seen, conductive layers are used within the rail-stacks and these layers and the resultant conductors may be fabricated from elemental metals such as tungsten, tantalum, aluminum, or copper, or metal alloys may be used, such as MoW. Metal silicides may also be used such as $TiSi_2$, or $COSi_2$, or a conductive compound such as TiN, or WC may be used. A highly doped semiconductor layer such as silicon is also suitable. Multiple layer structures may be used selecting one or more of the above.

Following the deposition of a conductive layer, a layer of semiconductor material (layer 15) such as silicon is formed over the conductive layer. This is typically a polysilicon layer; however, an amorphous layer may be used. Other semiconductor materials may be used such as Ge, GaAs, etc. In the embodiment of FIG. 1 this semiconductor layer is highly doped and, as will be seen, forms one-half a diode. After masking and etching steps, half rail-stacks are formed. These rail-stacks are "half" or partial rail-stacks since they are approximately half the thickness of the rail-stacks used in the next level.

Following a dielectric deposition and polish to form a dielectric fill, in the embodiment of FIG. 1, a material for the antifuses used to program the array is deposited. In one embodiment, the layer 20 is a dielectric such as silicon dioxide which is deposited by chemical vapor deposition (CVD) in a blanket deposition over the half rail-stacks and over a dielectric fill which fills the spaces between the rail-stacks. In another embodiment the layer 20 is grown on the upper surface of the silicon layer 15 and only exists on the rail-stacks.

Now a full set of memory array rail-stacks is formed on the layer 20. This comprises first the deposition of a lightly doped silicon layer 21 doped with a conductivity type dopant opposite to that used for the silicon layer 15, a heavily doped silicon layer 22 doped also opposite to the layer 15, a conductive layer 23 and a heavily doped silicon layer 24 doped with the same conductivity type dopant as layers 21 and 22. After masking and etching, the rail-stacks shown in FIG. 1, such as rail-stack 16, are formed. These rail-stacks are, as illustrated, in a direction perpendicular to the rail-stacks above and below them.

While not shown in FIG. 1 but as will be described later, the spaces between the rail-stacks after they are defined, are filled with a dielectric such as silicon dioxide. Then the rail-stacks and fill are planarized by CMP. In another embodiment spin-on-glass (SOG) is used to fill the voids. In this case chemical planarization can be used, for example, plasma etching. Other fill and planarization methods can be used.

After formation of the rail-stacks another antifuse layer 26 is formed, for instance, from a dielectric such as silicon dioxide, silicon nitride, silicon oxynitride, amorphous carbon or other insulating materials or combinations of materials. (Also an undoped layer of silicon may be used for the antifuse layer.)

Now another layer of rail-stacks are defined and only half rail-stacks are shown in FIG. 1 at this upper level. This half rail-stack comprises a silicon layer 28 doped with a conductivity type dopant opposite to that of layer 24. This is a lightly doped layer. Another silicon layer 30 is formed on layer 28 and this layer is doped with the same conductivity type dopant as layer 28, however, it is more heavily doped. Then a conductive layer 31 is formed above the layer 30.

Half rail-stacks are used at the very upper-most level of the array and at the very lowest level of the array. In between the half rail-stacks the full rail-stacks, such as rail-stack 16, are used throughout the array. If desired, a full rail stack can be used for the uppermost level of the array.

It should be noted that the silicon layers disposed on the conductive layers extend the entire length of the rail-stacks in the embodiment of FIG. 1 and are uninterrupted except possibly where vias are used to provide a conductive path to the substrate 10.

In FIG. 1 a path 32 is illustrated from a lower conductor in level 17 to an upper conductor in this level found in the rail-stack 18. This path is accessed in one embodiment through decoding circuitry in the substrate for both programming and reading of data into and from the array for one bit.

For instance, to program the bit, a relatively high voltage, 5–20V is applied between the conductors generally so as to forward-bias the "diode" between these conductors. This relatively high voltage causes a breach in the layer 26 creating a diode. Without this high voltage, the layer 26 remains an insulator. Thus, by selecting pairs of conductors, diodes can be selectively formed so as to program the array. While programming the array with the layers adjacent to the antifuse material being forward-biased is currently preferred, it is also possible to program using a reverse-biasing potential.

To sense the data programmed into the array, a voltage lower than that for programming is used. This voltage is applied so as to forward-bias the diode of the cell being accessed and thus allowing a sense amplifier to determine whether or not the layer 26 is intact between the rail-stacks. Note that "sneak" or parasitic paths in the array which would interfere with the sensing will include a reverse-biased diode.

Also as will be described later, the "anode" and "cathode" of the diodes are reversed at each of the successive antifuse layers. This facilitates easier programming and sensing since all of its conductors at each level are either bit lines or word lines. And, for instance, conductors at one height will serve as bit lines for two levels and conductors at the next height serve as word lines for two levels. This simplifies the decoding and sensing and more importantly reduces processing.

Figure 2:
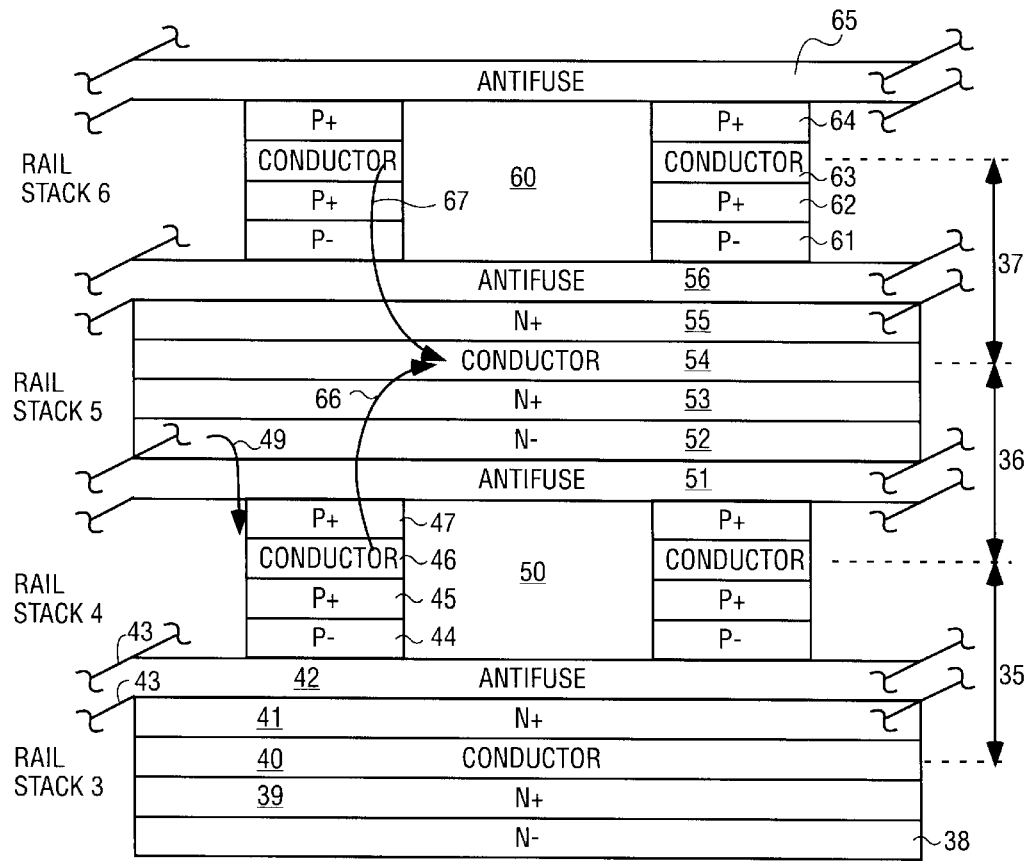
FIG. 2 is a cross-sectional elevation view of one embodiment of the present invented array.

Embodiment of FIG. 2

In the cross-section elevation view of FIG. 2, one embodiment is illustrated which corresponds to the embodiment shown in FIG. 1. In FIG. 2 the half rail-stacks of FIG. 1 are not illustrated. Three complete levels 35, 36 and 37 of the array are illustrated in FIG. 2. Below layer 38 of FIG. 2 other rail-stacks or half rail-stack are used. Also above layer 65, a full or half rail-stack is used.

Figure 3:
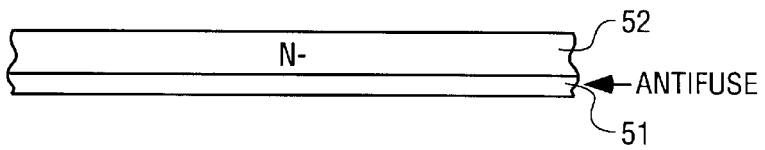
FIG. 3 is a cross-sectional elevation view of an antifuse and semiconductor layer formed during the fabrication of the invented array.

The rail-stack 3 comprising layers 38 through 41 includes a lightly doped N− layer 38, a heavily doped N+ layer 39, a conductor layer 40 and N+ layer 41. The fabrication of these rail-stacks will be discussed in more detail in conjunction with FIG. 3 through FIG. 13. An antifuse layer 42 which for the embodiment of FIG. 3 is a blanket deposition, covers all of the rail-stacks formed below layer 42 as well as the fill filling the voids between the rails. As mentioned, the layer 42 can be a deposited silicon dioxide in one embodiment.

It should be noted that N+ layers sandwich the conductor layer 40. These highly doped layers provide ohmic transitions to prevent unintended Schottky diode formation.

The layers above and below conductor 40 are not symmetrical for the embodiment illustrated in that an N− layer 38 is used below the conductor 40 and not above the conductor 40. Only a single lightly doped layer (in conjunction with a heavily doped layer) is needed to define a diode; the thickness of this lightly doped layer is important in controlling the break-down voltage, reverse leakage current and resistance of the diode so formed. The layer 41, a heavily doped semiconductor layer, and the fill are planarized after the rail-stacks are defined and then a blanket deposition of the antifuse layer 42 is formed on the layer 41. It is important to ensure that the planarization step exposes layer 41 everywhere so that the devices work properly. (The lines 43 in FIG. 2 are used to indicate that the antifuse layer 42 and like layers are not etched with the rail-stack below it and thus extend over the entire array for the illustrated embodiment.)

One advantage to the layer 42 and the other like layers in the structure, such as layers 51, 56 and 65, is that since they are an unbroken deposition, sidewall leakage (into the rail-stacks below) will be minimized, limiting electrical problems during reading and writing. When subsequent conductive material is deposited, it is unable to reach the sides of the rail-stacks below it because of this blanket deposition of the antifuse layer. For instance, path 49, which would allow silicon from layer 52 to cause a parasitic path, does not exist because of the unbroken blanket deposition of the antifuse layer 51.

Rail-stacks 4 comprising layers 44, 45, 46 and 47 are formed on the antifuse layer 42. Layer 44 is lightly doped with a P-type dopant for the embodiment illustrated followed by a P+ layer 45, a conductive layer 46 and a P+ layer 47. After these layers are deposited, they are masked and etched to define the rail-stacks. Then the voids between these rail-stacks, such as void 50, are filled with a dielectric. The fill dielectric is planarized along with a portion of P+ layer 47. Planarization is done at this point in the fabrication since there is generally poor control over the thickness and contour of the fill. The fill tends to build up on the rail-stacks when a non-spin-on deposition is used. This is followed by a blanket deposition of layer 51.

The process is now repeated, this time beginning with an N− layer 52 followed by an N+ layer 53, a conductive layer 54 and N+ layer 55. Again after defining the rail-stacks 5, the voids are filled and the surface is planarized. Another antifuse layer 56 is deposited.

The process is repeated for the rail-stacks 6 this time beginning with a P− layer 61, P+ layer 62, conductive layer 63, P+ layer 64. Again after defining the rail-stacks, filling the void 60 and then planarizing, another antifuse layer 65 is deposited.

As shown by the path 66, when a large enough voltage is applied between conductors 46 and 54, the antifuse layer 51, at the intersection of layers 47 and 52, is breached or ruptured creating a diode at the intersection. As mentioned, this is selectively done throughout the array to program the array. The conductor 54 is therefore a bit line for the "cells" above and below it. For instance, path 67 indicates another possible current path for another "cell" where the conductor 54 is again a bit line during sensing.

It should be noted that with the reversal of the P− and N− layers at each successive rail-stack, planarization always occurs on a heavily doped layer such as layer 47 and layer 55. Moreover, the lightly doped layers are always formed on relatively planar surfaces, consequently their thickness can be more easily controlled. This, as mentioned, allows the characteristics of the diode (once the intermediate antifuse layer is breached) to be more reliably controlled.

Processing Flow for the Embodiment of FIG. 2

The process flow for forming rail-stack 5 of FIG. 2 is illustrated in FIGS. 3–13. It will be apparent that the rail-stacks for the other embodiment can be similarly processed.

First, as shown in FIG. 3 an antifuse layer 51 is deposited. This typically is 25–200 Å of silicon dioxide which can be deposited with any one of very well-known processes. Following this, a silicon layer 52 is deposited which is typically 1000–4000 Å thick and formed with a CVD process where a phosphorous dopant is deposited along with the deposition of for instance, the polysilicon semiconductor material or where the dopant is ion implanted following the deposition of the layer. This layer is doped to a level between $5 \times 10^{15} – 1 \times 10^{18}/cm^3$.

In this application "polysilicon" layers may be deposited as polysilicon or may be formed from an amorphous silicon layer. In one embodiment, an amorphous silicon layer is deposited and annealed in a rapid thermal anneal (RTA) step of 800° C. for 1 minute. This increases the crystal sizes and activates the dopant. The dopant can be ion implanted or introduced during the deposition of the amorphous silicon layer.

Figure 4:
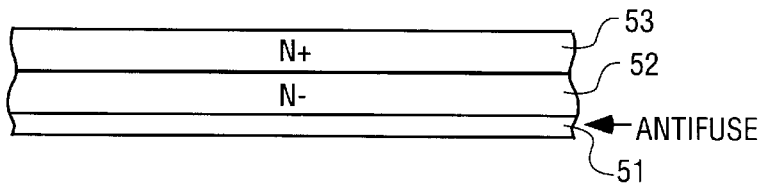
FIG. 4 illustrates the structure of FIG. 3 after an additional semiconductor layer has been formed.

Now, as shown in FIG. 4, a N+ layer 53 is deposited again using CVD. This layer may be approximately 300–3000 Å thick and in one embodiment is doped to a level of $>10^{19}/cm^3$.

Throughout this application two adjacent silicon layers are often shown such as layers 52 and 53, with different doping. These layers may be formed in one deposition by changing the dopant concentration during an in-situ deposition process. Alternatively, these layers may be formed with one deposition, followed by an ion implantation step at two different energy levels and dosages to obtain the two doping levels.

Figure 5:
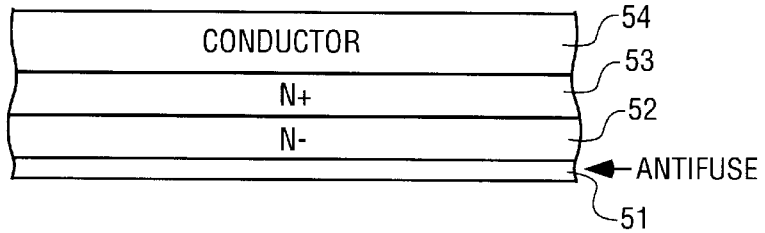
FIG. 5 illustrates the structure of FIG. 4 after a conductive layer is formed.

Next, as shown in FIG. 5, a conductive layer which may be 500–1500 Å thick is formed using any one of numerous well-known thin film deposition processes such as sputtering. A refractory metal may be used or a silicide of a refractory metal. Also as mentioned aluminum or copper can be used, or more simply the heavily doped silicon can be the conductor.

Figure 6:
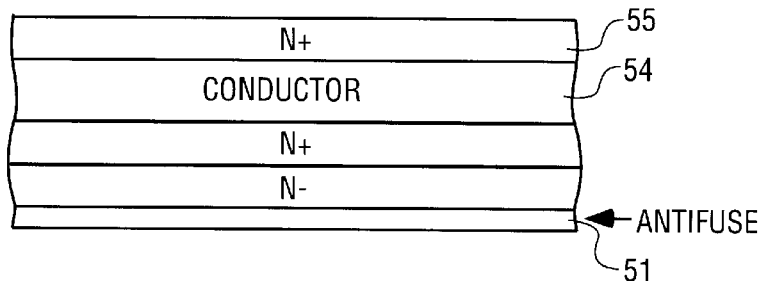
FIG. 6 illustrates the structure of FIG. 5 after an additional semiconductor layer has been formed.

Next, as shown in FIG. 6, another semiconductor layer of, for instance, polysilicon approximately 1500–2000 Å thick, is formed again doped to a level of >$10^{19}$/cm$^3$. This is shown as layer 55 in FIG. 6; after planarization its thickness is between 300 Å and 2000 Å thick.

Figure 7:
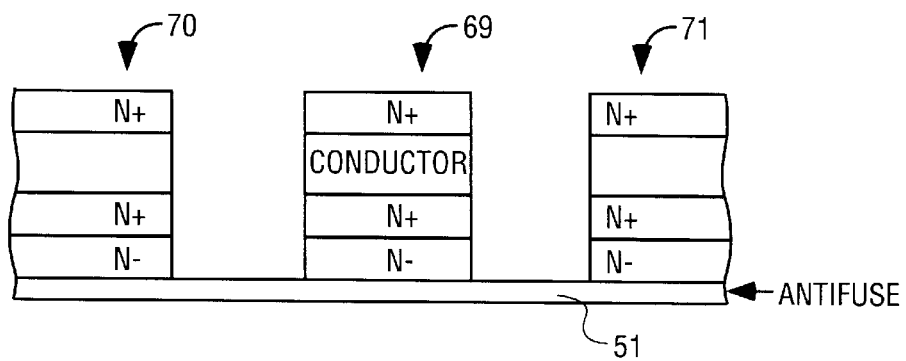
FIG. 7 illustrates the structure of FIG. 6 after a masking and etching step.

A masking and etching step is now used to define rail-stacks, such as rail-stacks 69, 70 and 71 shown in FIG. 7. Note that when comparing this view to the view of rail-stack 5 of FIG. 2, the view in FIG. 7 is taken from the side and consequently shows the individual rail-stacks. An ordinary masking and etching step, for instance, photolithography followed by plasma etching, may be used. Etchants can be used that stop on the antifuse layer thus preventing this layer from being etched away. Thus, layer 51 can be considered an etchant stop layer depending on the specific etchants used.

Figure 8:
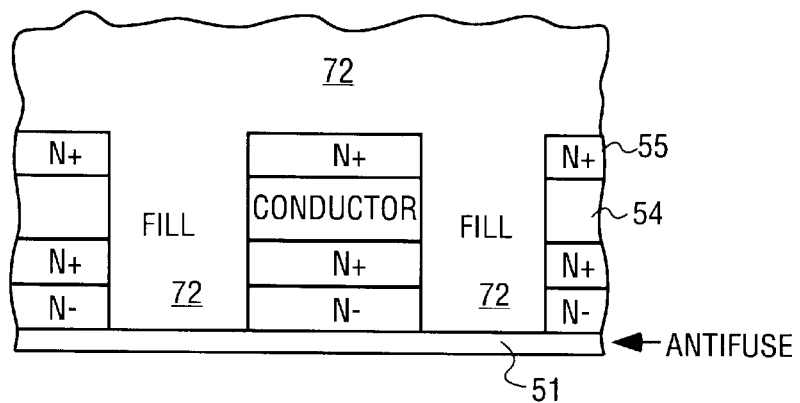
FIG. 8 illustrates the structure of FIG. 7 after open spaces left from the etching step have been filled.

Now as shown in FIG. 8, the spaces between the rail-stacks are filled with a dielectric 72 such as formed with a high density plasma chemical vapor deposition (HDPCVD) process.

Figure 9:
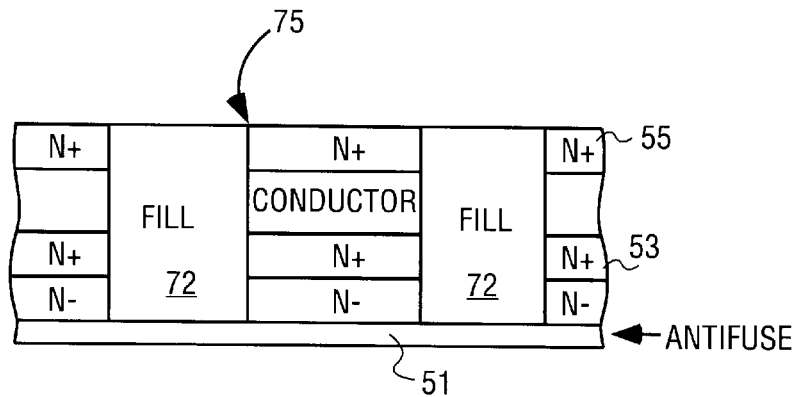
FIG. 9 illustrates the structure of FIG. 8 after a planarization step.

Chemical-mechanical polishing is then employed to planarize the upper surface of the rail-stacks shown in FIG. 9 in one embodiment. Chemical etching can also be used as mentioned with certain dielectrics. This planarization can reduce the thickness of the layer 55 to approximately 300 Å, thus this layer ends up being of approximately the same thickness as the layer 53. After planarization, the substrate has a planarized surface 75 whereby the top surface of the N+ regions of the rail stacks 69, 70 and 71 are substantially planar with the top surfaces of dielectric fill 72.

Surface Treatment Embodiments

Figure 10A:
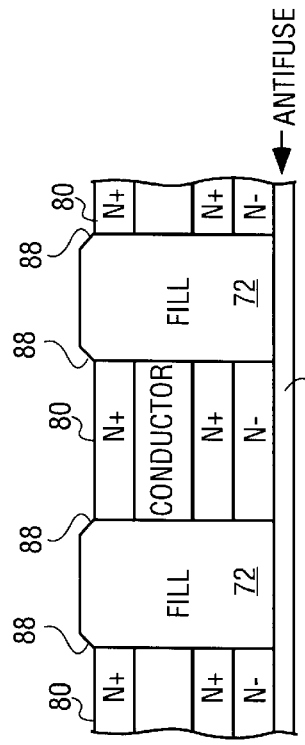
FIG. 10A illustrates the structure of FIG. 9 after the recessing of the top silicon film below the fill dielectric.

Next, in accordance with an embodiment of the present invention, a surface treatment is now used to improve the surface morphology and topology so that the anitfuse 56 can be reproducibly formed and reproducibly programmed. A surface treatment in accordance with a first embodiment of the present invention is set forth in FIGS. 10A–10D and the accompanying description. According to the first embodiment of the present invention, the substrate is subjected to a short silicon etch so that the top surface 80 of the top N+ silicon film 55 is slightly recessed below the top surface 82 of the fill dielectric 72 to form a recess 84 which is bounded by sidewalls 86 of fill dielectric 72 as shown in FIG. 10A. In an embodiment of the present invention, the top surface 80 of the N+ silicon film 55 is recessed approximately 5–150 Å below the top surface 82 of the dielectric fill material 72. In an embodiment of the present invention, the recess has a depth which is a fraction of the thickness desired for antifuse material 56.

Recess 84 can be formed utilizing any well-known etchant or technique which can preferentially etch the silicon film 55 with respect to fill dielectric 72 (i.e., use a silicon etch which is selective to the fill dielectric 72). In an embodiment of the present invention, the silicon etch is a nonpolymer forming etchant so that the silicon surface 80 stays atomically clean. A nonpolymer forming silicon recess etch which is selective to an oxide fill dielectric can be accomplished utilizing a $NF_3$ plasma etch or a $CF_4$ and $O_2$ plasma etch. In an alternative embodiment of the present invention, the silicon recess etch is accomplished utilizing a wet etch such as a wet etch comprising nitric acid and hydrofluoric acid or a wet etch comprising KOH.

Figure 10B:
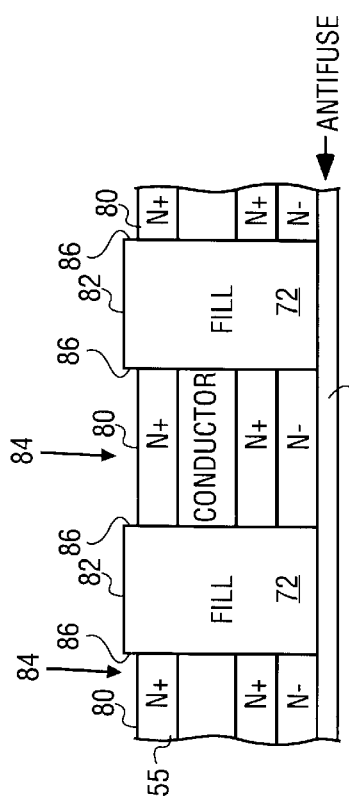
FIG. 10B illustrates the structure of FIG. 10a after beveling the sidewalls of the fill dielectric.

Next, as shown in FIG. 10B, if desired, in an embodiment of the present invention the silicon recess etch is followed by a short sputter etch to shape the sidewall 86 of the oxide fill 72 into a sloped sidewall 88 as shown in FIG. 10B. A slopped sidewall 88 allows the subsequently deposited antifuse material 56 to be more uniform as it transitions from the fill dielectric to the silicon surface 80. Additionally, the sputter etch can be used to remove contaminants. During sputter etching, care should be taken not to roughen the surface 80 of the silicon film 55 too much and thereby create nonuniformities across the surface 80. A sputter etch which removes 25–50 Å $SiO_2$, such as a sputter etch with Argon ions with between 100–1000 volts bias and a pressure between 0.1–5.0 mtorrs, is suitable.

Figure 10C:
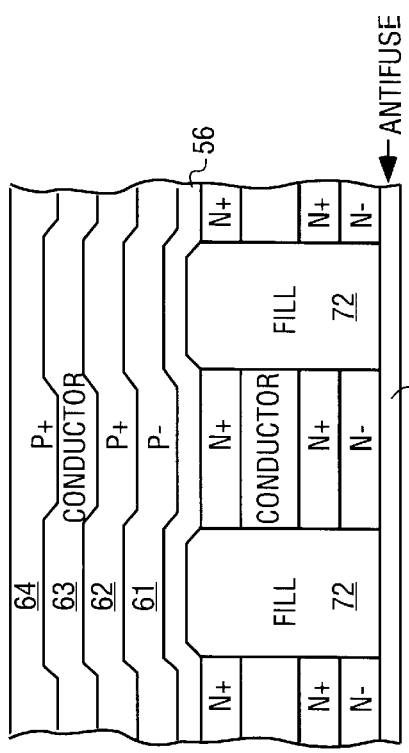
FIG. 10C illustrates the structure of FIG. 10B after the deposition of a antifuse layer.

Next, as shown in FIG. 10C, after the silicon recess etch (and sputter etch, if used) the antifuse material 56 is blanket deposited over and onto surface 80 of silicon film 55 and surface 82 and sidewall 88 of dielectric fill 72. In an embodiment of the present invention, the antifuse material 56 is deposited to a thickness which is sufficient to completely fill recess 84 with antifuse material. Completely filling the recess 84 with antifuse material 56 helps to insure uniform film coverage over a corner 89 of the silicon film which helps to prevent electric field enhancement at the silicon corner 89. In this way, the antifuse material 56 over the silicon corner 89 is at least as thick as the antifuse material 56 formed on horizontal silicon surfaces. In an embodiment of the present invention, the deposited antifuse material is an oxide. A deposited oxide antifuse material can be formed by a plasma enhanced chemical vapor deposition (PECVD) process utilizing a deposition chemistry comprising $SiH_4$ and $O_2$. Alternatively, a deposited oxide antifuse 56 can be a thermally deposited oxide such as a low temperature oxide (LTO) deposited by thermal disassociation of $SiH_4$ and $O_2$ at a temperature between 350–600°. Alternatively, a deposited oxide antifuse can be a high temperature oxide (HTO).

Figure 10D:
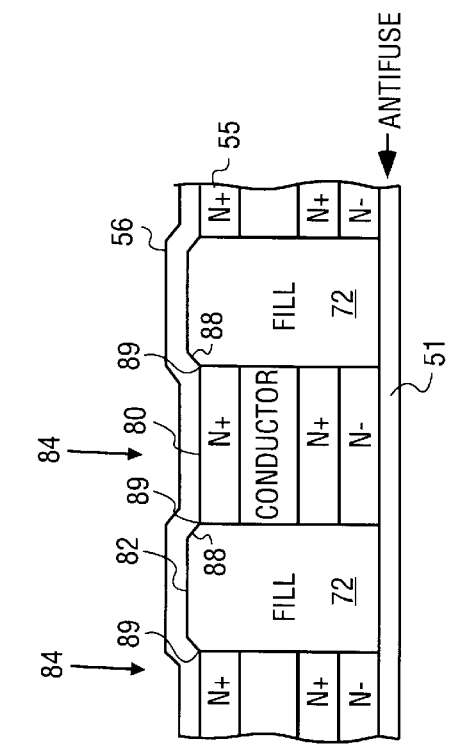
FIG. 10D illustrates the structure of FIG. 10C after the formation of a second plurality of rail stacks.

Next, as shown in FIG. 10D, a plurality of rail stacks 6 are formed on antifuse material 56. In order to form rail stacks 6 a lower P– type silicon film 61 is blanket deposited over and onto antifuse material 56 followed by the sequential blanket deposition of a P+ type silicon film 62, conductor 63, and a P+ type silicon film 64. The p type silicon films (61, 62 and 64) can be formed by the same technique and to the same thickness and concentrations, but by utilizing opposite conductivity type dopants (e.g., boron) as n type silicon films 52, 53 and 55 of rail stack 5. Conductor 63 can be formed over the same material and to the same thickness and by the same technique as conductor 54. The films of rail stack 6 would then be patterned by well-known photolithography and etching techniques into a plurality of spaced-apart rail stacks which run in a direction perpendicular to the plurality of rail stacks (69, 70 and 71) of rail stacks 5. A fill 60 would then be formed over and between the plurality of spaced-apart rail stacks 6 and planarized the form a planar surface. The planar surface would then be treated in accordance with the surface treatment of the present invention to improve the uniformity and performance of subsequently formed antifuse 65.

A surface treatment in accordance with another embodiment of the present invention is set forth in FIGS. 11A–11D. According to this embodiment of the present invention, first surface 80 of silicon film 55, as shown in FIG. 11A, is etched below surface 82 of the fill dielectric 72 so that a recess 88 is formed which is bounded by sidewalls 86 of fill dielectric 72. In this embodiment of the present invention, the recess 84 is formed to a depth which is greater than the thickness desired of the antifuse material 56. Recess 84 can be formed by techniques and with etchants as described above. Next, if desired, the silicon recess etch can be followed by a sputter etch as described above to produce sloped sidewalls 88 as shown in FIG. 11B.

Next, as shown in FIG. 11C, an antifuse material is grown on silicon surface 80 of recess 84. An oxide antifuse material 56 can be grown by exposing the substrate to an oxidizing ambient such as $O_2$ or $H_2O$ (without a silicon source gas) while heating the substrate or creating a plasma. Such a processes will selectively grow silicon dioxide on locations where silicon is available to oxidize, such as silicon surface 80, and will not grow on locations, such as fill dielectric 72, where silicon is unavailable for oxidation. In an embodiment of the present invention, antifuse 56 is an oxide grown by exposing the substrate to a high density plasma (HDP) formed from $O_2$ molecules. Alternatively, a suitable grown oxide antifuse 56 can be formed by a thermal process, such as a furnace oxidation in a wet ambient such $H_2O$, or a rapid thermal oxidation utilizing an $O_2$ ambient. Because the silicon surface 80 is sufficiently recessed below the surface 82 of the fill dielectric 72 and because the antifuse material 56 is grown, as opposed to deposited, the grown antifuse oxide is constrained by the sidewalls 88 of recess 84. In this way, an antifuse material 56 is formed which has a very uniform thickness across the surface 80 of the N+ silicon film 55. A uniform antifuse film 56 across the surface of N+ silicon film 55 helps insure a uniform and reliable antifuse programming and performance. Although forming sloped sidewalls is not required, they are especially useful when growing an oxide by a high density process because corners can become charged or create shadowing which can create deflections in the ionized oxygen atoms leading to nonuniform film growth.

Next, as shown in FIG. 11D, a plurality of the rail stacks (rail stacks 6) are formed over and onto antifuse material 56 as well as onto the surface of dielectric fill material 72. Rail stacks 6 can be formed as described above.

FIGS. 12A–12C-1 and 12C-2 detail an alternative surface treatment in accordance with an embodiment of the present invention. According to this embodiment of the present invention, as shown in FIG. 12A, the substrate of FIG. 9 is subjected to a short dielectric etch which etches away the top of the dielectric film so that the top surface 90 of the fill dielectric 72 is recessed below the top surface 92 of the upper N+ silicon film 55 of rail stack 5 to form a recess 94 which is bounded by the sidewalls 96 of the silicon film 55. According to this embodiment of the present invention, the dielectric fill material is recessed below silicon surface 92 so that a convex corner or protrusion 97 is formed at the top edge of the N+ silicon film. In an embodiment of the present invention, the top surface 90 dielectric fill material 72 is recessed between 50–200 Å below the top surface 92 of silicon film 55. The fill dielectric 72 can be recessed with any well-known etchant which can preferentially etch the fill dielectric without substantially etching silicon film 55 (i.e., recess is formed with a fill dielectric etch that is selective to silicon). If the fill dielectric is an oxide and if the top semiconductor material is silicon then a plasma etch comprising $CHF_3$ and $O_2$ can be used. Preferably, a wet etch comprising HF and $H_2O$ can be used.

Next, as shown in FIGS. 12B-1 and 12B-2, the antifuse material 56 is formed onto and over the surface 92, corner 97, and sidewalls 96 of semiconductor material 55. In an embodiment of the present invention, as shown in FIG. 12B-1, the antifuse material 56 is a deposited oxide formed to a thickness between 20–80 Å. A deposited oxide antifuse film can be formed as described above. Because the antifuse 56 in FIG. 12B-1 is deposited, it is also forms on surface 90 of recessed fill dielectric 72 as shown in FIG. 12B-1. Alternatively, in an embodiment of the present invention as shown in FIG. 12B-2, the antifuse material is an oxide grown to a thickness between 20–80 Å. Because the oxide is grown, it forms only on exposed silicon regions, such as surface 92, corner 97, and sidewalls 96 and does not form on surface 90 of fill dielectric 72 as shown in FIG. 12B-2.

Next, as shown in FIGS. 12C-1 and 12C-2, a plurality of rail stacks (rail stacks 6) are formed onto antifuse material 56. When a deposited antifuse is used, as shown in FIG. 12C-1, the rail stack is formed on the antifuse on the silicon film 55 and fill dielectric 72. When a grown antifuse is used, it forms on the antifuse on the silicon film and forms on the fill dielectric 72 as shown in FIG. 12C-2. Rail stacks 6 can be formed as described above. It is to be appreciated that as shown in FIGS. 12C-1 and 12C-2, the corner 97 of the N+ silicon extends above the fill dielectric. Such a protruding corner creates a high electric field at the corner during programming. In this way, the antifuse material 56 will always "blow" or rupture at the region 99 above corner 97. Because the antifuse material 56 always "blows" or ruptures at corner 97, a thicker antifuse film can be used which lowers the overall leakage of the cell while still retaining a low breakdown (programming) voltage.

Figure 13B:
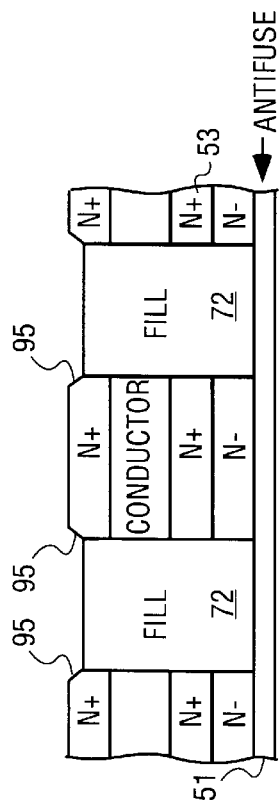
FIG. 13B illustrates the structure of FIG. 13A after the sidewalls of the top silicon film of the rail stacks have been beveled.
Figures 2, 13C:
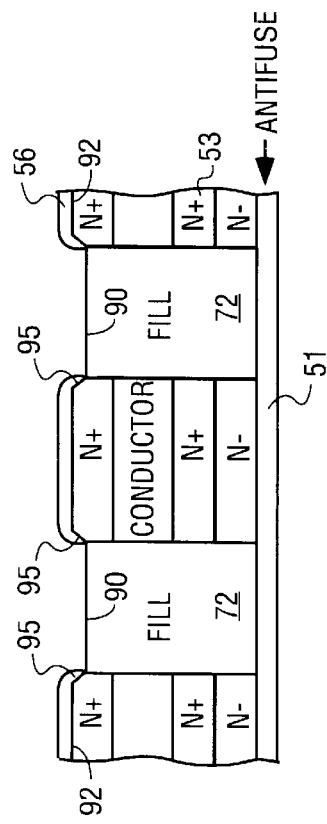
Figure 13A:
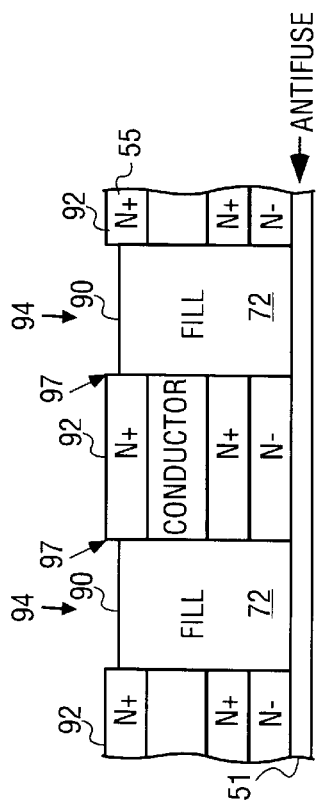
FIG. 13A illustrates the structure of FIG. 9 after the recessing of the fill dielectric beneath the top surface of the rail stacks.
Figures 1, 13C:
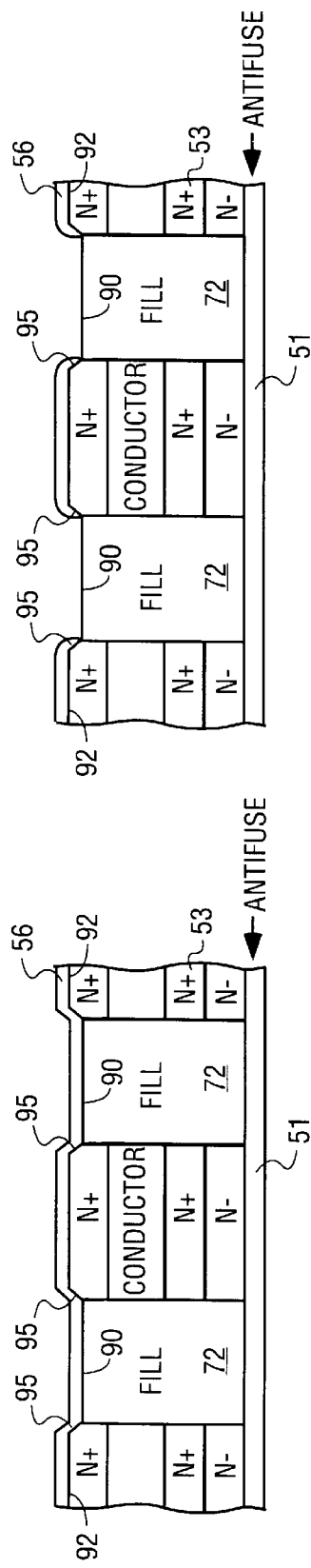

FIGS. 13A–13D-1 and 13D-2 detail another surface treatment in accordance with another embodiment of the present invention. First, as shown in FIG. 13A, the fill dielectric is recessed below the top surface of the N+ silicon film 55 to form a recess 94 and expose corner 97 of the N+ silicon film. The fill dielectric can be recessed as described with respect to FIG. 12A.

Next, as shown in FIG. 13B, a sputter etch is used to chamfer or bevel corner 97. A sputter etch has a higher yield at an angle of approximately 45° to the surface of the substrate creating a beveled corner 95 in silicon film 55 having a slope at an angle of approximately 45°. A sputter etch process which has 25–50 Å $SiO_2$ equivalent removal can be used, such as the sputter etch described above.

Next, as shown in FIGS. 13C-1 and 13C-2, the antifuse film 56 is formed on top of surface 92 and on beveled corner 95. In an embodiment of the present invention, as shown in FIG. 13C-1, the antifuse material is a deposited oxide formed to a thickness between 20–80 Å. A deposited oxide antifuse film can be formed as described above. When the antifuse film 56 is deposited, it also forms on surface 90 of recess fill dielectric 72 as shown in FIG. 13C-1. Alternatively, in an embodiment of the present invention, as shown in FIG. 13C-2 the antifuse material is a grown oxide grown to a thickness between 20–80 Å. Because the oxide antifuse is grown, it forms only on exposed silicon regions, such as surface 92 and beveled corner 95, and does not form on surface 90 of fill dielectric 72 as shown in FIG. 13C-2. An oxide antifuse film can be grown as described above.

Next, as shown in FIGS. 13D-1 and 13D-2, a plurality of rail stack 6 are formed onto and over antifuse material 56. Rail stacks can be formed as described above. When a deposited antifuse is used as shown in FIG. 13D-1, the plurality of rail stack 6 is formed on the antifuse material on the silicon film 55 and on the antifuse on fill dielectric 72. When a grown antifuse 56 is used, as shown in FIG. 13D-2, the plurality of rail stacks are formed on the antifuse material on the silicon surface 92 and directly onto the surface 90 of fill dielectric 72. Thus, several surface treatments have been described which yield a novel antifuse cell structure which is characterized by a more reproducible and controllable antifuse programming and lower device leakage.

Hard Mask Embodiment of the Present Invention

FIGS. 14A–14F and FIG. 15 and FIG. 16A–16B, detail an embodiment of the present invention where a hard mask is used to create recessed fill dielectrics (to create silicon protrusions) or recessed silicon films to ensure that all memory arrays can be programmed at substantially the same voltage by controlling the location at which the antifuse material ruptures and/or by controlling the thickness and uniformity of the antifuse material.

Overview of a Hard Mask Embodiment of the Present Invention

A thin (e.g., 1500 Å) silicon nitride ($SiN_x$) layer is deposited above a silicon layer by plasma enhanced chemical vapor deposition (PECVD), and used as both a hard mask during array patterning and a polish stop during chemical-mechanical planarization (CMP). Alternatively, the masking layer may be deposited in a LPCVD furnace. A thin (e.g., 200 Å) buffer oxide layer can be formed on the silicon layer prior to the silicon nitride layer to protect the underlying silicon layer. The use of $SiN_x$ as an etch hard mask as well as a CMP stopping layer is a well established component of the shallow trench isolation (STI) manufacturing process. The process flow corresponding to an embodiment is as follows: (1) blanket deposition of array rail-stack materials, culminating with a $SiN_x$ film; (2) photolithography used to delineate array features; (3) array patterning by plasma etching using the $SiN_x$ layer as a hard mask (note that additional benefits of the hard mask may include better CD control over the non-hard mask case); (4) gap fill, typically with HDP-CVD silicon dioxide, where the height to which the gaps are filled can be chosen carefully as will be discussed below; (5) CMP, with the $SiN_x$ acting as the polish stop, using a CMP slurry that erodes silicon dioxide at a much faster rate than $SiN_x$ such as a silica slurry or ceria ($CeO_2$) slurry; (6) post-CMP clean typically in an $NH_4OH$-based scrub; (7) $SiN_x$ removal via plasma or wet etching; and (8) growing or CVD blanket deposition of an antifuse layer.

In step (4) above, the spaces of the line/space arrays are filled with silicon dioxide. The height of the fill for these spaces (gaps) is selected in order to effect the protrusion or recession of the array lines in the antifuse layer once the $SiN_x$ is stripped. That is, if the gap fill target height corresponds to the lower edge of the $SiN_x$ layer, no protrusion or recession is targeted. If a line recession is desired, the gap is filled to a point above the lower edge of the $SiN_x$ layer, with the absolute fill height a function of the degree of recession desired. If a line protrusion is desired, the gap is filled to a point below the lower edge of the $SiN_x$ layer, with the absolute fill height again a function of the degree of protrusion desired. In short, a protrusion or recession (or lack thereof) is selected in order to manipulate the antifuse rupture (i.e., cell programming) process. For example, a uniform protrusion or recession of array lines over the wafer surface may result in more repeatably programmable memory cells due to electric field concentration at the protrusion or recession corners. Likewise, it may be that devices constructed this way are more reliable.

A Specific Hard Mask Embodiment of the Present Invention

Figure 14A:
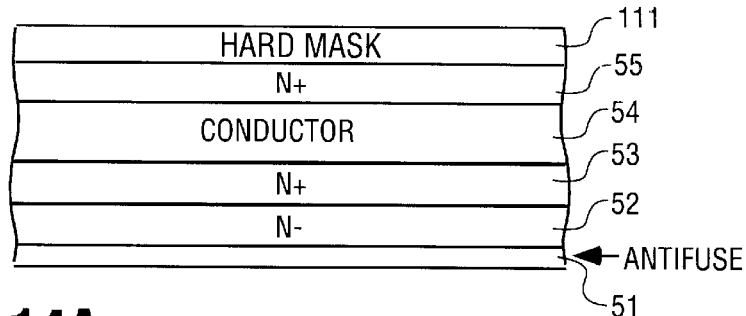
FIG. 14A illustrates the structure of FIG. 6 after the formation of an overlying hard masking layer.

Like the surface treatment embodiments of FIGS. 10–13, the hard mask embodiment will be described with respect to the formation of the antifuse devices formed between the intersections of the fifth and sixth rail stacks of FIG. 2. Accordingly, processing occurs as set forth in FIGS. 3–6. After the formation of the N+ silicon film 55 as shown in FIG. 6, a hard mask layer 111 is formed on the silicon film 55 as shown in FIG. 14A. The layer 111 may be formed from material such as silicon nitride to a thickness of 1500 Å. Other materials that may be used as the hard mask layer 111 include but are not limited to TiN, tungsten, and tungsten silicide ($WSi_2$). The layer 111 should be of a hard material, that is, a material that erodes more slowly than the dielectric filling material used in a subsequent step. As will be seen the layer 111, after patterning, acts as a polish stop for a planarization step. Typically, the hard masking layer 111 will include a lower thin (25–200 Å) buffer oxide layer to protect the silicon.

Figure 14B:
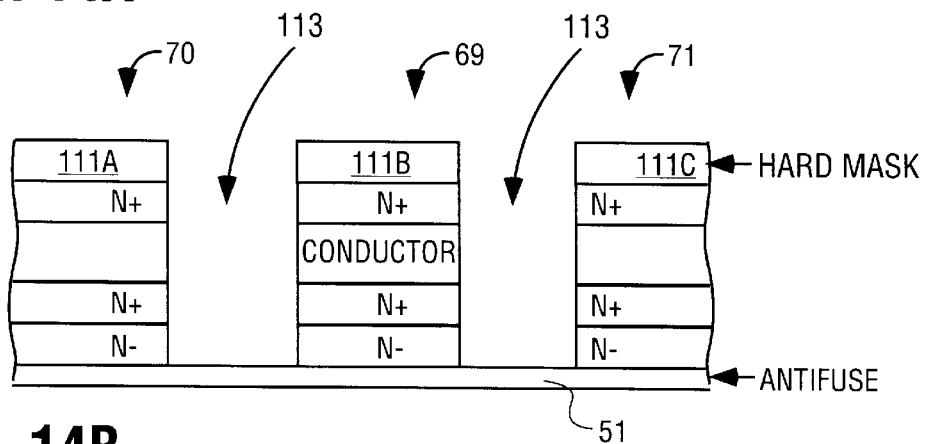
FIG. 14B illustrates the structure of FIG. 14A after the mask and silicon layers have been patterned.

After the layer 111 as been formed, it is patterned using ordinary photolithographic steps to form a mask. In one embodiment the layer 111 defines parallel spaced-apart lines. This is shown in FIG. 14B where the layer 111, after patterning includes the masking features 111a, 111b and 111c. Additionally, as shown in FIG. 14B the films of rail stacks are etched in alignment with the mask forming the lines 70, 69 and 71. Spaces 113 result between the lines as shown in FIG. 14B.

Following the etching shown in FIG. 14B, the spaces 113 between the lines 70, 69, and 71 are filled with a dielectric material 72, such as a CVD formed silicon dioxide or other dielectric material. This material is chosen to be softer than the masking layer 111, as mentioned. An important example is the use of a CMP slurry that is selective to silicon dioxide over the silicon nitride. That is, the erosion rate of silicon dioxide is much greater than that of silicon nitride using such slurry.

Figure 14C:
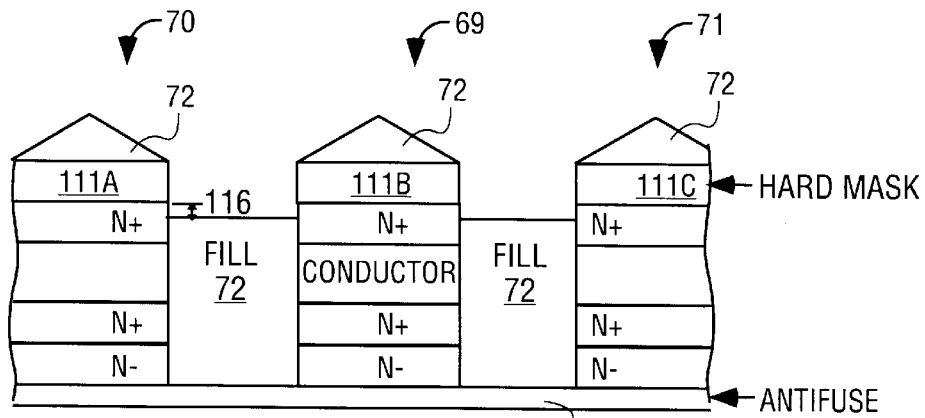
FIG. 14C illustrates the structure of FIG. 14B after a dielectric filling material is formed.
Figure 14D:
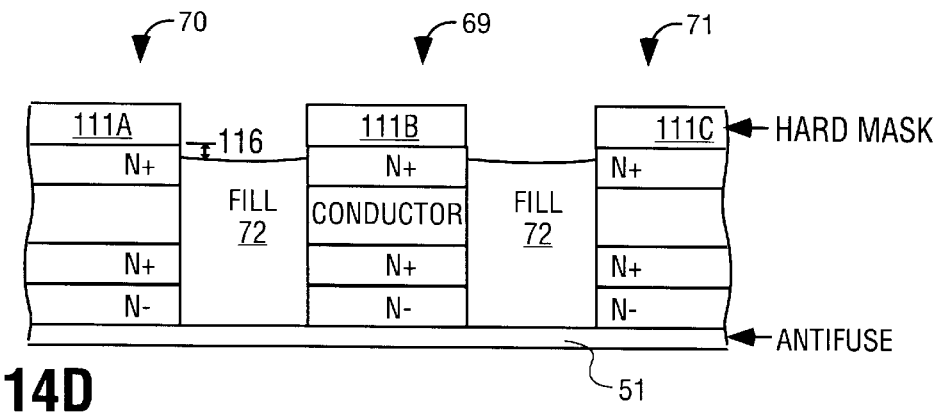
FIG. 14D illustrates the structure of FIG. 14C after a planarization step.

With the present invention in one embodiment, the fill 72 as shown in FIG. 14C is filled to a level below the upper surface of the rails 70, 69, and 71. This is shown by dimension 116. In an embodiment of the present invention, the fill is between 50–500 Å below the upper surface of rails 70, 69, and 71. Fill 72 accumulates on the tops of the masking members as a result of filling the dielectric material between the lines. Well-known processing steps are used to assure the desired height of the fill between the lines.

Next in the process, planarization occurs which removes the dielectric material from the upper surfaces of the masking members. While chemical planarization may be used, in one embodiment chemical-mechanical polishing (CMP) is preferred. The etchants used in such planarization are selected from commercially available etchants such that the dielectric material is eroded without significant etching of the mask. In effect, the mask acts as an erosion stop for the resultant structure shown in FIG. 14D. Note that the erosion does not significantly affect the fill level between the lines and that the fill 72 between the lines remains below the upper surface as shown by dimension 116 in FIG. 14D.

Now the mask 111a, 111b, and 111c is removed using, for instance, an ordinary step which selectively removes the silicon nitride without disturbing the underlying silicon and the fill 72. A hot phosphoric acid strip can remove the silicon nitride mask. A HF dip can then be used to remove the thin buffer oxide, if used.

Figure 14E:
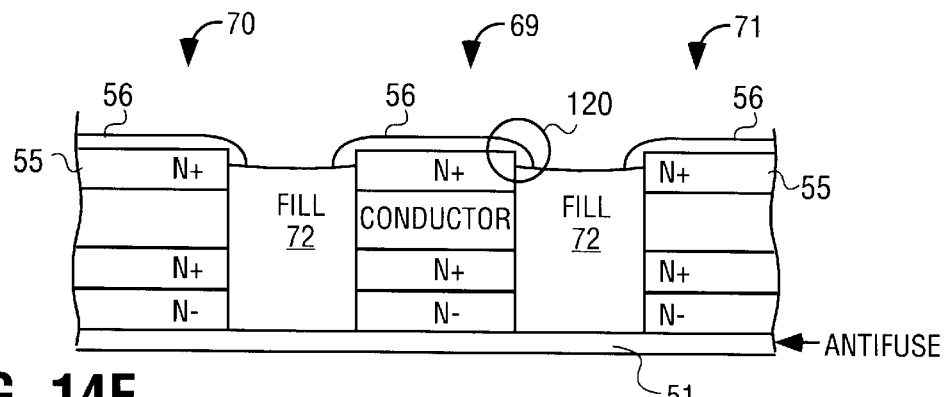
FIG. 14E illustrates the structure of FIG. 14D after the hard mask has been removed and an antifuse layer of a thermally grown oxide has been formed.

Following this, for the embodiment shown in FIG. 14E, a thermally grown oxide is grown on the exposed upper surface of silicon film 55 of the lines 70, 69, and 71. In one embodiment, this oxide is grown at a temperature of 600° C. in a steam atmosphere for one hour. This results in an antifuse layer 56 of silicon dioxide having a nominal thickness of 50 Å.

The resultant structure of FIG. 14E is shown by the silicon film 55 of the lines 70, 69, and 71 protruding from the fill material. This protrusion assists in providing the enhanced programming. As shown within the circle 120 of FIG. 14E, when the oxide is thermally grown it tends to be slightly thinner at the corners or edges of the polysilicon lines when compared to the central portion of the lines.

Figure 14F:
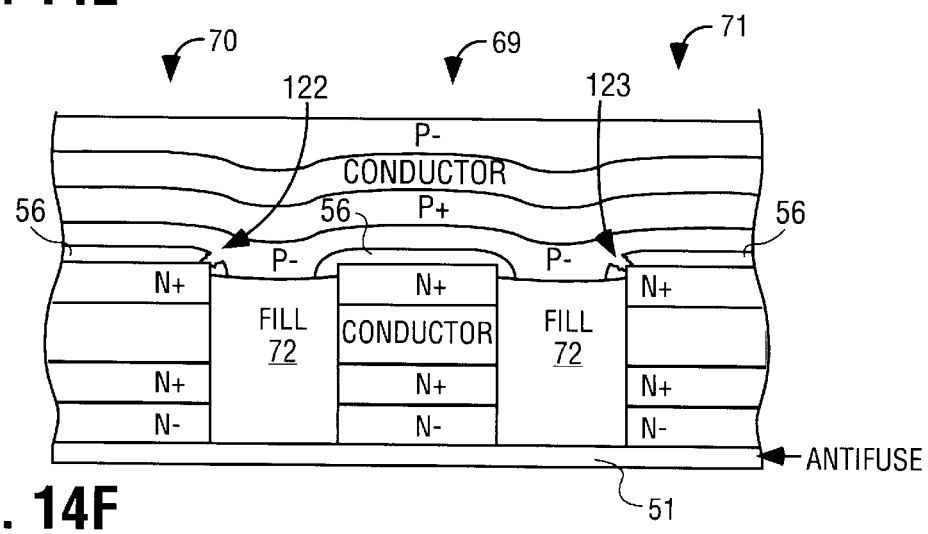
FIG. 14F illustrates the structure of FIG. 14E after the formation of a plurality of rail stacks have been formed and where two of the three resulting cells are programmed by rupturing or breaching the thermally grown oxide layer.

Subsequently, the silicon films of rail stack 6 are formed over the structure of FIG. 14E and patterned into transverse spaced-apart lines lying above the structure of FIG. 14E as shown in FIG. 14F.

Again referring to FIG. 14F, a memory cell is formed where each of the lines 70, 69, and 71 project into the sixth rail. Each cell has an antifuse layer (silicon dioxide layer 56) disposed between the P type and the N type halves of a diode. To program these cells, the diode is forward biased with a potential great enough to rupture or breach the silicon dioxide layer. This causes a conductive path during memory read cycles through the cell when the diode is forward biased at a potential lower than that needed to program the cell. The breaks 122 and 123 in the layer 56 indicate that the cells associated with lines 70 and 71 are programmed. The layer 56 associated with the line 69 remains intact indicating that this cell is not programmed. Thus, two of the cells may be considered to be programmed with a binary 1 with the other containing a binary 0.

As shown in FIG. 14F, the ruptures 122 and 123 in layer 56 occur at the corners of the protruding silicon films of lines 70 and 71, respectively. The reason this occurs is because of the enhanced electric field associated with the edges of the lines and the thinner region of the layer 56 which occurs during its growth at the edges as shown within the circle 20 of FIG. 14E. Both of these factors or at least one of them is present to assist in programming.

Other Hard Mask Embodiments

Figure 15:
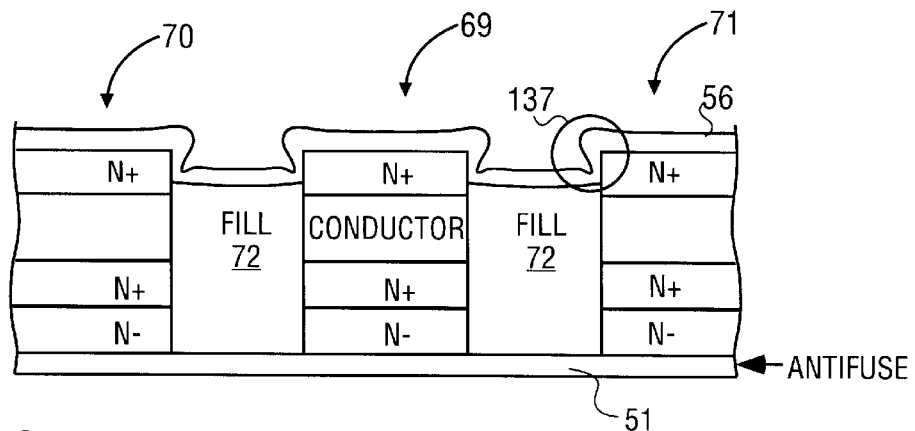
FIG. 15 illustrates an alternate embodiment of the present invention where a deposited antifuse layer is formed after the filling step.

Another hard mask embodiment is shown in FIG. 15. Once again for this embodiment the silicon lines 69, 70 and 71 along with the fill 72 are formed in the same manner as the corresponding structure shown in FIG. 14D, and the hard mask is removed. In this embodiment, rather than growing the antifuse layer 56, a deposited silicon dioxide layer is used. A plasma-enhanced CVD silicon dioxide layer 56 is then deposited on the substrate. This layer also covers the fill 72 unlike the grown oxide of FIG. 14E. This embodiment has the advantage of not requiring the higher temperature needed for growing an oxide. Once again the silicon film 55 of lines 70, 69, and 71 protrude from the fill 72. As shown within the circle 137, the side of the line 71 protrudes into a thinner oxide region. This again provides for the enhanced programming as discussed above. When the fill is recessed sufficiently below the top surface of the silicon film 55, the deposited oxide tends to be thinner on the sidewalls of the rails than on the top surface of the rails or on the fill dielectric as shown in FIG. 15, due to shadowing by the corners during deposition. In this embodiment, the antifuse layer tends to open along the protruding line closer to the fill rather than at the corner of the line when programmed. Thus, this embodiment is similar to the prior embodiment except that a deposited antifuse layer is used.

Figure 16A:
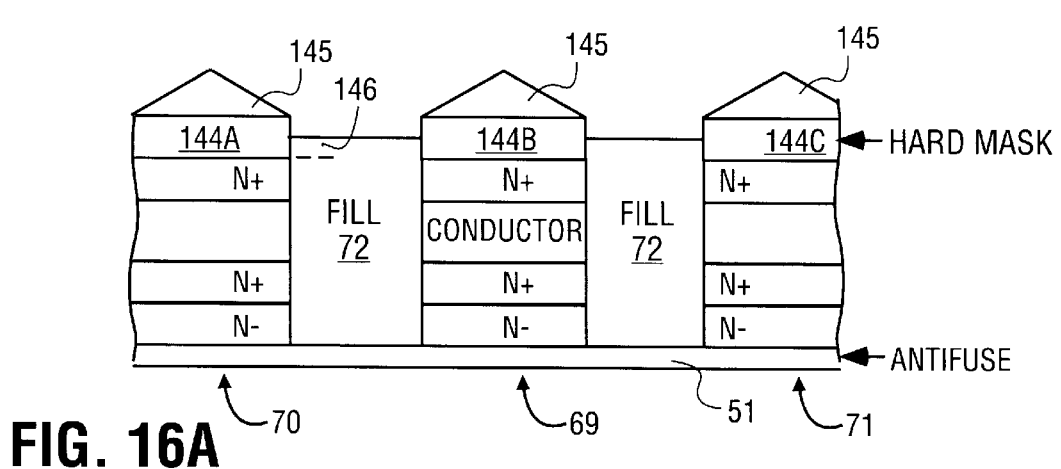
FIG. 16A illustrates another embodiment of the present invention where the filling material is filled above the level of the etched silicon lines.
Figure 16B:
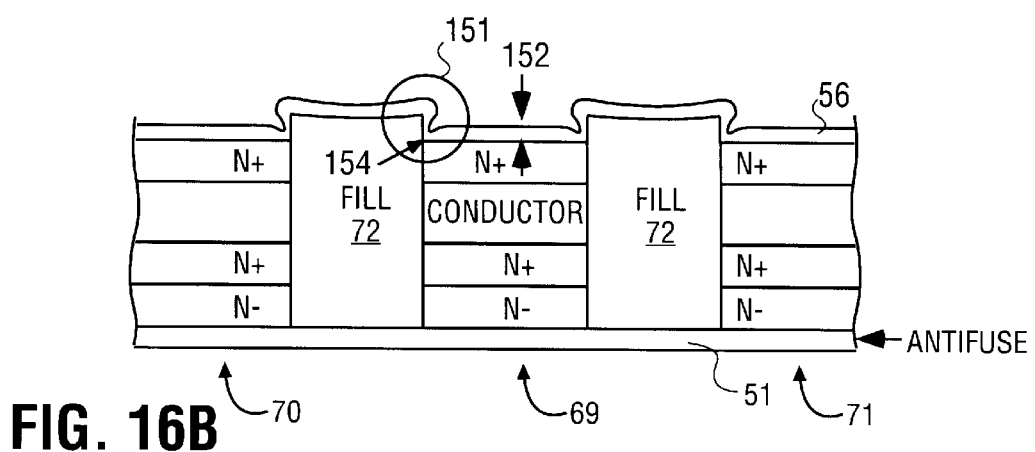
FIG. 16B illustrates the structure of FIG. 16A after planarization, the removal of a hard mask and the formation of an antifuse layer.

FIGS. 16A and 16B show yet another hard mask embodiment where rather than protrusions, recessions in the antifuse layer in the central region of the polysilicon lines occur. Again, as was the case in the prior hard mask embodiments, the silicon layer is etched using a hard mask which is first patterned as shown by the masking features 144A, 144B and 144C and the polysilicon line 70, 69 and 71, respectively of FIG. 16A. The spaces between the lines are then filled with a fill material 72, again a material which is softer than the mask, this time however, to a level above the lower surface of the hard mask. As shown in FIG. 16A by the dimension 146, the fill 72 is above the upper surface of the hard mask by for instance, 1000 Å.

Once again, the fill accumulates on the hard mask as shown by the dielectric material 145.

CMP or other planarization is used to planarize the wafer, with the mask acting as a stop. Now the mask is removed with a selective etchant which selects the silicon nitride over the thin silicon dioxide buffer film and silicon dioxide filling material. The resultant structure includes fill which is higher than the corresponding lines as shown in FIG. 16B. A silicon dioxide antifuse layer 56 is deposited or grown over the wafer. When the antifuse is deposited by, for example PECVD, this results in a thinner silicon dioxide at the fill/silicon line interface 154 as shown within circle 151 and a thicker antifuse in the region of the silicon lines between the edges of the line as shown by dimension 152. This may be used where it is desired, by way of example, to cause a breach of the antifuse during programming to occur at the edge 152 of the line.

The advantages of the described hard mask embodiments of the present invention include:

The ability to consistently introduce array line protrusion or recession by using a polish stopping layer in combination with a slurry system that displays the required selectivities. This recession/protrusion or lack thereof may be advantageous from a cell standpoint.

The possibility of depositing significantly less sacrificial silicon as the terminal array material, decreasing device cost due to the need for less furnace time.

Due to decreased stack heights as a result of the need for less sacrificial silicon, less etch time is needed to pattern the arrays, and less fill oxide deposition time is needed to fill the spaces. This decreases device costs by reducing fab capital expenditure.

Increased ease in addressing depth-of-focus issues, since the narrow array features can tolerate longer overpolishing without eroding the active line material. Therefore wider features such as landing pads and scribe line structures can be cleared, avoiding the excessive topography that causes depth-of-focus problems.

The ability to exploit the body of knowledge in place for STI CMP, for example post-CMP cleans.

And perhaps most importantly, the invention provides a more reliable cell, particularly from the programming standpoint.

Thus, an improved method for forming lines in a three-dimensional memory array and an antifuse layer has been described.

We claim:

1. A method of forming a memory comprising:
   forming a first plurality of spaced apart rail-stacks having a top semiconductor film;
   forming a dielectric film having a top surface between said plurality of first rail-stacks;
   etching said semiconductor film of said first plurality of spaced apart rail-stacks so that said semiconductor film is recessed below said top surface of said dielectric film;
   forming an antifuse material on said etched semiconductor film of said first plurality of spaced apart rail-stacks; and forming a second plurality of spaced apart rail-stacks on said antifuse material, said second plurality of spaced apart rail-stacks having a lower semiconductor film on said antifuse material.

2. The method of claim 1 wherein said antifuse material is an oxide film grown on said etched semiconductor surface of said first plurality of spaced apart rail-stacks.

3. The method of claim 2 wherein said oxide is constrained by the sidewalls of said dielectric film.

4. The method of claim 1 wherein said antifuse material is an oxide film deposited onto said semiconductor material on said first plurality of spaced apart rail-stacks and on said dielectric film between said rail-stacks.

5. The method of claim 4 wherein said recess is less than the thickness of said antifuse material.

6. The method of claim 4 wherein said antifuse material is deposited to a thickness sufficient to completely fill said recess.

7. The method of claim 1 wherein said semiconductor material is etched with a nonpolymer forming method.

8. The method of claim 1 wherein said etching utilizes a $NF_3$ plasma.

9. The method of claim 1 wherein said recess forming etch is a wet etch comprising nitric acid and hydrofluoric acid.

10. The method of claim 1 further comprising after recessing said semiconductor material of said first plurality of spaced apart rail-stacks, sputter etching said dielectric fill so as to form sloped sidewalls.

11. The method of claim 1 wherein said semiconductor material of said first plurality of spaced apart rail-stacks is recessed between 5–150 Å below the top surface of said dielectric fill material.

12. A method of forming a memory comprising:
    forming a first plurality of spaced apart rail-stacks having a top semiconductor film;
    forming a dielectric film between said first plurality of spaced apart rail-stacks;
    etching said dielectric film below the top surface of said semiconductor material of said first plurality of spaced apart rail-stacks to form a convex corner at the top edge of said semiconductor material;
    forming an antifuse material on and over said corner of said semiconductor material of said first plurality of spaced apart rail-stacks; and
    forming a second plurality of spaced apart rail-stacks on said antifuse material, said second plurality of spaced apart rail-stacks having a lower semiconductor film on said antifuse material.

13. The method of claim 12 further comprising sputter etching said semiconductor material after recessing said oxide below the top surface of said semiconductor material and before depositing said antifuse material.

14. The method of claim 13 wherein said sputter etch bevels said corner of said semiconductor material.

15. The method of claim 12 wherein said antifuse material is an oxide deposited by plasma enhanced chemical vapor deposition process.

16. The method of claim 15 wherein said plasma enhanced chemical vapor deposition process is a high density plasma process.

17. The method claim 12 wherein said oxide is recessed between 5–150 Å below the top surface of said semiconductor material of said first plurality of spaced apart rail-stacks.

18. The method of claim 12 wherein said dielectric is a grown oxide.

19. The method of claim 18 wherein said oxide is grown with a high density plasma process (HDP).

20. The method of claim 19 wherein said oxide is grown with a thermal process.

21. A method for fabricating a three-dimensional array comprising:
    forming a silicon layer having an upper surface;
    forming a masking layer over the silicon layer;
    patterning the masking layer;
    etching at least the silicon layer in alignment with the patterned masking layer to define memory array features, the features having an upper surface;
    filling between the features with a dielectric material which is softer than the masking layer to a level below the upper surface of the features;
    planarizing the dielectric material with the masking layer acting as a stop;
    removing the patterned masking layer; and
    forming an antifuse layer on the upper surface of the features such that the features protrude into the antifuse layer.

22. The method defined by claim 21 wherein the antifuse layer is formed by a blanket deposition covering the features and the dielectric material.

23. The method defined by claim 22 wherein the antifuse layer is silicon dioxide.

24. The method defined by claim 22 wherein the silicon layer is formed by an annealing an amorphous silicon layer.

25. The method defined by claim 24 wherein the silicon dioxide is deposited by chemical-vapor-deposition (CVD).

26. The method defined by claim 21 wherein the antifuse layer is grown from the silicon layer.

27. The method defined by claim 26 wherein the grown silicon dioxide layer is grown in a steam atmosphere.

28. The method defined by claims 21 wherein the masking layer comprises a top silicon nitride layer and a lower silicon dioxide layer.

29. The method defined by claim 28 wherein dielectric material is silicon dioxide.

30. The method defined by claim 29 wherein the planarization comprises chemical-mechanical polishing.

31. The method defined by claim 30 wherein the silicon layer is a polysilicon layer.

32. The method defined by claim 30 wherein the polysilicon layer is a doped layer.

33. A method for fabricating a three-dimensional array comprising:
    forming a silicon layer having an upper surface;
    forming a masking layer over the silicon layer, the masking layer having a lower surface in contact with the upper surface of the silicon layer;
    patterning the masking layer;
    etching at least the silicon layer in alignment with the patterned masking layer to define memory array features, each of the features having an upper surface;
    filling between the features with a dielectric material which is softer than the masking layer to a level above the upper surface of the features;
    planarizing the dielectric material with the masking layer acting as a stop;
    removing the patterned masking layer;
    forming an antifuse layer on the upper surface of the features such that the antifuse layer has recessions.

34. The method defined by claim 33 wherein the silicon layer is formed from an amorphous silicon layer.

35. The method defined by claim 33 wherein the antifuse layer is a blanket deposition covering the features and the dielectric material.

36. The method defined by claim 35 wherein the antifuse layer is silicon dioxide.

37. The method defined by claim 36 here silicon dioxide is deposited by chemical-vapor-deposition (CVD).

38. The method defined by claim 37 wherein the masking layer comprises a material selected from the group consisting of silicon nitride, titanium nitride, tungsten and tungsten silicide.

39. The method defined by claim 38 wherein the dielectric material comprises silicon dioxide.

40. The method defined by claim 39 wherein the planarization step comprises the use of chemical-mechanical polishing.

41. The method defined by claim 40 wherein the silicon layer is a polysilicon layer.

42. The method defined by claim 41 wherein the polysilicon layer is doped.

43. A method for forming a three-dimensional memory array comprising:
   forming a masking layer on an upper surface of a silicon layer;
   forming memory features from the silicon layer using the masking layer;
   filling spaces between the memory features with a filling material which etches more quickly than the masking layer, to a level below the upper surface of the silicon layer;
   planarizing the filling material using the masking layer as an etchant stop;
   removing the masking layer;
   forming an antifuse layer on the memory features, such that the antifuse layer is thinner at the edges of the features than midway between the edges of the features.

44. The method defined by claim 43 wherein the planarization comprises chemical-mechanical polishing.

45. The method defined by claim 44 wherein the silicon comprises doped polysilicon.

46. The method defined by claim 45 wherein the filling comprises silicon dioxide.

47. The method defined by claims 43 wherein the antifuse layer comprises a deposited silicon dioxide layer.

48. The method defined by claims 43 wherein the antifuse layer comprises a grown silicon dioxide layer.

49. The method defined by claim 47 wherein the masking layer comprises a top silicon nitride layer and a lower silicon dioxide layer.

50. The method defined by claim 48 wherein the masking layer comprises silicon nitride.

51. The method defined by claim 45 wherein the memory features comprise parallel, spaced-apart lines.

52. A method for fabricating a three-dimensional memory array comprising:
   forming a polysilicon layer;
   forming a masking layer having an upper silicon nitride layer and a lower silicon dioxide layer over the polysilicon layer on an upper surface of the polysilicon layer;
   patterning the masking layer;
   etching at least the polysilicon layer in alignment with the patterned masking layer to define parallel, spaced-apart memory lines;
   filling spaces between the memory lines with a dielectric material which polishes more readily than silicon nitride to a level below the upper surface of the polysilicon memory lines;
   polishing the dielectric material with the silicon nitride layer acting as a polish stop;
   removing the silicon nitride layer;
   forming a silicon dioxide layer over the polysilicon lines such that the silicon dioxide layer is thinner at the edges of the lines than at the center of the lines.

53. The method defined by claim 52 wherein the forming of the polysilicon comprises annealing an amorphous silicon layer.

54. The method defined by claim 52 wherein the silicon dioxide layer is a grown layer grown from the polysilicon lines.

55. The method defined by claim 54 wherein the silicon dioxide layer is grown in a steam atmosphere.

56. The method defined by claim 52 wherein the silicon dioxide layer is a deposited layer.

57. The method defined by claims 52 or 56 wherein the polysilicon lines are doped with a first conductivity-type dopant.

58. The method defined by claim 57 wherein another layer of polysilicon doped with a second conductivity type dopant is deposited over the silicon dioxide layer.

* * * * *